(12) United States Patent
Bocko et al.

(10) Patent No.: US 7,023,369 B2
(45) Date of Patent: Apr. 4, 2006

(54) MULTIPLEXED-INPUT-SEPARATED SIGMA-DELTA ANALOG-TO-DIGITAL CONVERTER DESIGN FOR PIXEL-LEVEL ANALOG-TO-DIGITAL CONVERSION

(75) Inventors: Mark F. Bocko, Caledonia, NY (US); Zeljko Ignjatovic, Rochester, NY (US)

(73) Assignee: University of Rochester, Rochester, NY (US)

( * ) Notice: Subject to any disclaimer, the term of this patent is extended or adjusted under 35 U.S.C. 154(b) by 6 days.

(21) Appl. No.: 10/890,231

(22) Filed: Jul. 14, 2004

(65) Prior Publication Data

US 2005/0073451 A1    Apr. 7, 2005

Related U.S. Application Data

(60) Provisional application No. 60/486,468, filed on Jul. 14, 2003.

(51) Int. Cl.
*H03M 3/00*    (2006.01)

(52) U.S. Cl. .................. 341/143; 341/141; 341/155; 250/208.1; 348/241

(58) Field of Classification Search ............... 341/141, 341/143, 155
See application file for complete search history.

(56) References Cited

U.S. PATENT DOCUMENTS

| | | | |
|---|---|---|---|
| 5,248,971 A | 9/1993 | Mandl | |
| 5,515,046 A | 5/1996 | Mandl | |
| 5,659,315 A | 8/1997 | Mandl | |
| 5,877,715 A | 3/1999 | Gowda et al. | |
| 5,886,659 A | 3/1999 | Pain et al. | |
| 6,130,423 A * | 10/2000 | Brehmer et al. | 250/208.1 |
| 6,166,367 A * | 12/2000 | Cho | 250/208.1 |
| 6,225,934 B1 | 5/2001 | Ohashi et al. | |
| 6,380,880 B1 | 4/2002 | Bidermann | |
| 6,518,907 B1 | 2/2003 | Tsai | |
| 6,532,040 B1 * | 3/2003 | Kozlowski et al. | 348/241 |
| 6,538,591 B1 | 3/2003 | Sato et al. | |
| 6,545,624 B1 | 4/2003 | Lee et al. | |
| 6,597,371 B1 | 7/2003 | Mandl | |

* cited by examiner

*Primary Examiner*—Peguy Jeanpierre
*Assistant Examiner*—Khai M. Nguyen
(74) *Attorney, Agent, or Firm*—Blank Rome LLP

(57) ABSTRACT

An image-sensing element has an array of photodiodes or other photodetecting elements and performs sigma-delta analog-to-digital conversion on the outputs of the photodetecting elements. The sigma-delta analog-to-digital converters have components divided between pixel-level and row-level structures, with each row-level structure connected to its pixel-level structures to define a multiplexed-input-separated sigma-delta analog-to-digital converter. The converter can include an integrator or can rely on an integration effect of the photodetecting element. The feedback required for sigma-delta analog-to-digital conversion can involve digital-to-analog converters located at each row-level structure or at each pixel-level structure.

22 Claims, 9 Drawing Sheets

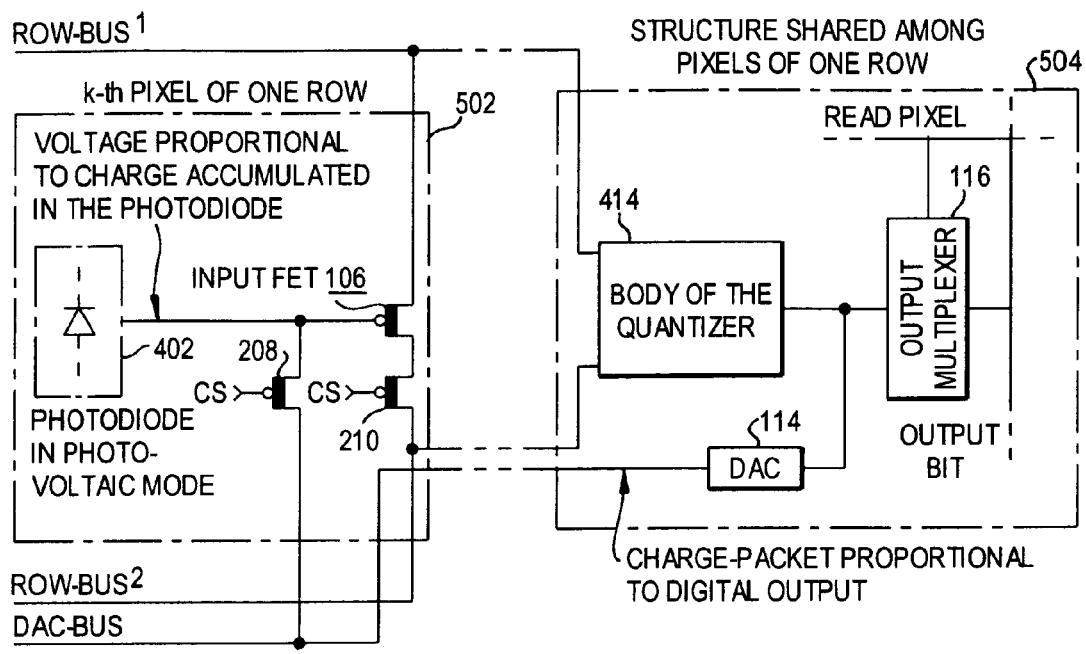
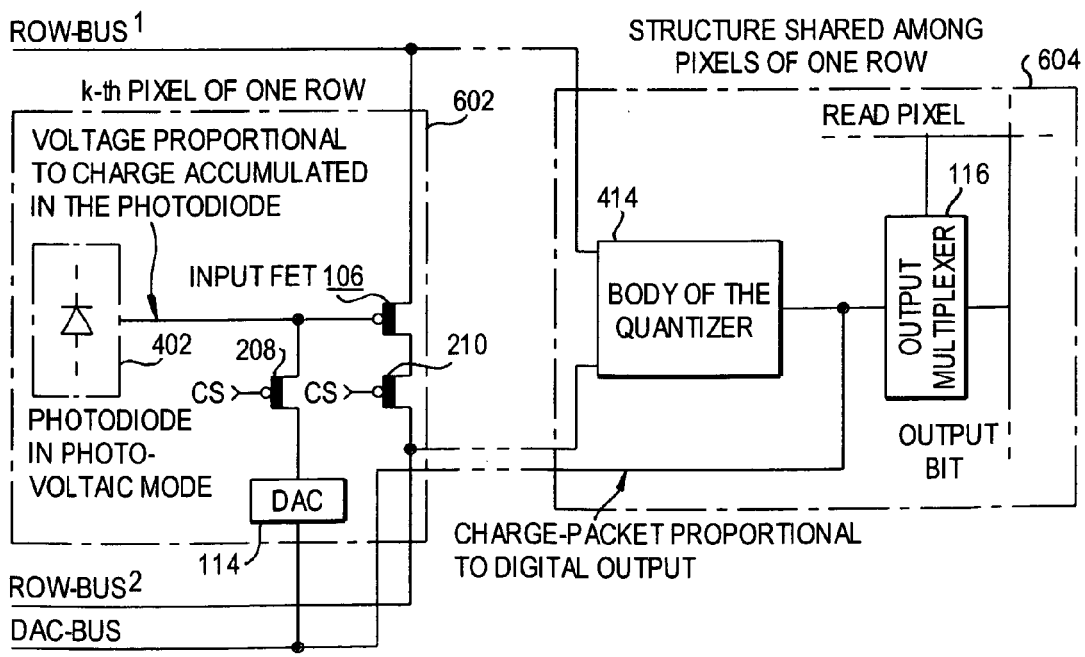

MULTIPLEXED-INPUT-SEPARATED SIGMA-DELTA ANALOG-TO-DIGITAL CONVERTER DESIGN FOR PIXEL-LEVEL ANALOG-TO-DIGITAL CONVERSION

REFERENCE TO RELATED APPLICATION

The present application claims the benefit of U.S. Provisional Patent Application No. 60/486,468, filed Jul. 14, 2003, whose disclosure is hereby incorporated by reference in its entirety into the present disclosure.

FIELD OF THE INVENTION

The present invention is directed to a sigma-delta ($\Sigma\Delta$) analog-to-digital converter (ADC) design and more particularly to a multipexed-input-separated (MIS) $\Sigma\Delta$ ADC design adapted for use as a pixel-level ADC in a pixel readout circuit employed in a CMOS image sensor.

DESCRIPTION OF RELATED ART

Charge-coupled-device (CCD) imagers were first developed in the 1970's in the defense sector but quickly found acceptance among professional astronomers when they began using CCD cameras instead of photographic films and plates. There were several advantages that favored CCD cameras over photographic film:

CCD cameras are up to 100 times more sensitive than film

CCD images are readily digitized, eliminating film-processing

CCD cameras have a much greater dynamic range than film, so they can more easily capture both faint and bright details in a single exposure CCD imagers have greater spatial resolution than film, so they can resolve finer details Throughout the last two decades CCDs have been the most widely used imaging technology. They have continued to improve and their principal advantages such as sensitivity (or quantum efficiency) of about 80%, very high dynamic range (five orders of magnitude) and linearity are still the highest among all commercially available imagers. However, the biggest disadvantage of CCD imagers is their small format and/or high price. CCD sensors also rely on specialized fabrication technology that requires dedicated and costly manufacturing processes. The drawbacks of CCD imaging technology are the following:

High-price due to specialized fabrication technology,

High-power consumption,

Random pixel access is not possible, i.e., pixels must be read out sequentially making it impossible for CCD imagers to easily access a subset of pixels within an image, Low yields that are caused by a huge area (over 50%) of the imager being covered by a thin or inter-poly oxide that is prone to oxide punch-through Data is transferred from the imager in the form of analog charge packets. Due to losses there is a maximum safe shifting distance limiting the practical size of the image sensor Relatively slow frame rates Charge-coupled devices were the prevailing technology for image capture for 30 years; however, by the late 1990s, they began to be replaced in key applications by CMOS image sensors. CMOS technology has emerged as the dominant technology for digital circuit designs due to its favorable power-speed tradeoff and the high level of integration possible. As a result, CMOS has also attracted significant efforts toward implementation in a variety of mixed-signal designs. Thus, both analog preprocessing (filtering, amplification and A/D conversion) and digital processing have been combined in singlechip designs that may be fabricated with relatively inexpensive processes. CMOS technology also may be used to create inexpensive and effective imagers as well. Although the parameters such as sensitivity, dynamic range, and linearity of the CMOS imagers are inferior to CCD imagers, CMOS imagers have shown other advantages. For example, CMOS image sensors can be made at standard manufacturing facilities that produce almost 90% of all semiconductor chips, which significantly decreases their designing and manufacturing costs. Along with less expensive design and manufacturing, CMOS imagers have the following advantages:

Two orders of magnitude smaller power consumption compared to CCD imagers. This is a great advantage in battery-powered portable applications.

Available random access to pixel regions of interest within the imager. In CMOS imagers both the photodetector and the readout electronics are part of each pixel. This allows the charge from each photodetector to be converted into voltage/current values that can be randomly addressed and read out. Column and row addressability allows for window-of-interest readout (windowing). The windowing provides a greater flexibility in applications that need image processing (e.g. image compression, motion detection, or target tracking).

Intra-pixel amplification and analog-to-digital conversion accommodate faster frame rates. This advantage is particularly important in machine-vision and motion-analysis applications.

Transport of the pixel read out data in digital form rather than analog simplifies driving high-speed signals off-chip.

Output signals are less sensitive to crosstalk and pick-up.

CMOS technology allows most of the digital signal processing to be performed on-chip (e.g. image compression, color encoding, anti jitter algorithms, multiresolution imaging, motion tracking, and control over wireless transmission links).

Small pixel area (high spatial resolution), high dynamic range (equally good response to both low and high light intensities), high linearity, and high frame rate are the most important features required of CMOS imager designs. Recently, along with the development of a variety of battery-powered devices, low power consumption has also emerged as an important requirement. Thus the pixel readout circuits have emerged as critical design elements of CMOS imagers and a variety of approaches have been used differing mostly by the number of pixels serviced by a single readout circuit. Designs range from readout circuits dedicated to each pixel up to circuits that are used to read out blocks of pixels, the various designs making different trade-offs in size, power, and performance.

The conventional CMOS image sensor architecture for today's consumer cameras and cell phones is the Active Pixel Sensor (APS). This was first developed in the 1980s and puts an amplifier at every pixel, but does the analog to digital conversion elsewhere on the chip. The more advanced chips are Digital Pixel Sensors (DPS), which achieve lower noise by doing the analog to digital conversion at the pixel level. Pixim uses a conventional "Nyquist" ADC at each pixel. Pixim and SmaL use this Nyquist ADC at each pixel and increase the dynamic range by additional processing and storing multiple images.

The following four U.S. patents, naming William Mandl as inventor, are directed to image-sensor architecture:

U.S. Pat. No. 5,248,971, "Method and apparatus for multiplexed over-sampled analog to digital modulation", Sep. 28, 1993

U.S. Pat. No. 5,515,046 "Method and apparatus for multiplexed over-sampled analog to digital modulation" May 7, 1996

U.S. Pat. No. 5,659,315 "Method and apparatus for multiplexed over-sampled analog to digital modulation" Aug. 19, 1997

U.S. Pat. No. 6,597,371 "System for digitally driving addressable pixel matrix, Jul. 22, 2003 However, in embodiments having external capacitance, the integrator is supplied for each pixel. As a consequence, the amount of circuitry associated with each pixel increases the minimum pixel size and decreases the fill factor. Also, in embodiments in which the photodetecting elements have an integration effect, the input transistor is multiplexed across a whole row; thus, crosstalk is a concern. Further, Mandl requires a non-standard CMOS (something between CCD and CMOS).

SUMMARY OF THE INVENTION

It is an object of the invention to combine the small pixel size offered by performing analog-to-digital conversion away from the pixel level with the advantages in terms of high linearity, low power consumption and the like offered by performing analog-to-digital conversion at each pixel. To achieve the above and other ends, the present invention uses a multiplexed-input-separated $\Sigma\Delta$ ADC at each row rather than at each pixel. In one embodiment, an input transistor of the integrator and an external capacitor are supplied at the pixel level; while the remainder of the integrator and entire quantizer are supplied at the row level. In another embodiment, in which the photodetecting element is used as an integrator, the input transistor of the quantizer is supplied at the pixel level, while the remainder of the quantizer is supplied at the row level.

The digital-to-analog converter (DAC) used in feedback can be provided either for each row or for each pixel or it can be shared among neighboring pixels (e.g., 2×2 pixel neighborhood). The photosensitive elements in each row are connected over row buses to the integrator and quantizer used in the $\Sigma\Delta$ ADC. Each photosensitive element has switches, responsive to a column select (CS) signal, for connecting that photosensitive element's amplifier to the row buses and to the feedback signal provided by the DAC.

The present invention uses a Multiplexed-Input-Separated Sigma-delta ADC, which provides a dynamic range much improved over the Nyquist ADC architecture. This image sensor with a pixel-level ADC embodies the advantages of both modern over-sampling sigma-delta ADC's and the design principles of low transistor count CMOS imager pixel readout circuits. Due to the over-sampling nature of the architecture, the transistors can be small to enable high resolution with a high fill-factor. The design inherently has high linearity and low power consumption. The dynamic range of the design is intrinsically greater than 78 dB, or 13 bits, but could be greater by running at higher sampling frequency and higher power drain.

The present claimed invention offers the following advantages over the technology of the Mandl patents. In embodiments with external capacitance, the integrator can be supplied at the row level rather than the pixel level, thus decreasing minimum pixel size and increasing fill factor. In embodiments in which the photodetector is used as an integrator, the input transistor is supplied at the pixel level, thus reducing crosstalk. All embodiments can be implemented using standard technologies such as CMOS.

The inventors' previous work in $\Sigma\Delta$ ADC's is found, e.g., in U.S. Pat. No. 6,707,409, whose disclosure is hereby incorporated by reference in its entirety into the present disclosure.

BRIEF DESCRIPTION OF THE DRAWINGS

Preferred embodiments of the present invention will be set forth in detail with reference to the drawings, in which:

FIG. 5 is a schematic diagram showing a first variation of a second preferred embodiment of the present invention, based on the design of FIG. 4 and having a DAC located at the row-level structure;

FIG. 6 is a schematic diagram showing a second variation of the second preferred embodiment of the present invention, based on the design of FIG. 4 and having a DAC located at the column-level structure;

DETAILED DESCRIPTION OF THE PREFERRED EMBODIMENTS

Figure 1:
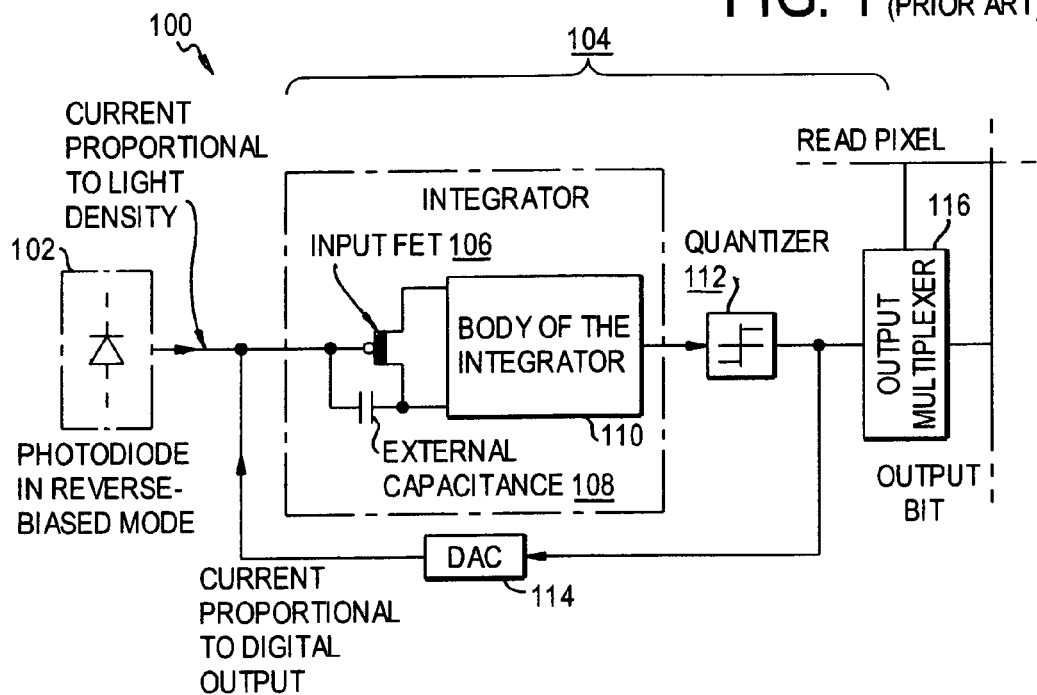
FIG. 1 is a schematic diagram showing a known $\Sigma\Delta$ ADC design for a single pixel using an external capacitance.

Preferred embodiments of the invention will be set forth in detail below with reference to the drawings, in which like reference numerals correspond to like elements throughout.

Each preferred embodiment uses one of two basic principles, one in which the intra-pixel integrator structure is realized with an external capacitance, and the other in which the integration effect of the photodiode in the photo-voltaic mode is used.

The first basic principle will be explained with reference to a block schematic of a known first-order pixel level $\Sigma\Delta$ ADC structure, where the intra-pixel integrator structure is realized with the external capacitance, as shown in FIG. 1. In the structure 100, a block 102 that represents a photosensitive element contains the photodiode and possibly a biasing circuit to keep the diode in the reverse-biased mode. While in reverse-bias mode, the voltage across the diode's terminals is kept constant, and the current is proportional to the light intensity. In conversion mode, when the ΣΔ ADC 104 converts the input signal, this current is integrated onto the external capacitor. An input FET 106 and external capacitor 108 are drawn separately from the rest of the integrator's body 110, because they will be separated from the integrator body 110 in the proposed structure to be described below. The output of the integrator 110 is quantized by a quantizer 112. A block that represents the digital-to-analog converter (DAC) 114 creates a feedback signal required for ΣΔ ADC. It senses the digital output and accordingly creates a current. This feedback current is integrated along with the input signal current. The resulting signal is output from the image sensor by an output multiplexer 116.

In the first preferred embodiment, the structure of FIG. 1 is modified such that only the input FET 106 and the external capacitance 108, and possibly the DAC 114, are provided for each pixel, with the remainder of the ΣΔ ADC 104 being moved away from the pixel and supplied for each row to form a MIS ΣΔ ADC. There are thus two variations of the first preferred embodiment, one with a row-level DAC and one with a pixel-level DAC. The two variations of the first preferred embodiment will now be described.

In regard to the placement of the DAC, we could pull the DAC out of the pixel site and make it a row-shared structure. This results in the general first-order MIS ΣΔ ADC structure (with external DAC) with intra-pixel integrator employing external capacitance, shown in FIG. 2 as 200. An input FET 106 and external capacitor 108 are retained within the pixel site 202 along with the photosensitive block 102. The remainder of the ΣΔ ADC structure is in a row-level structure 204.

In order to accommodate multiplexing, three extra switches 206, 208, 210 are added. These switches are driven by the Column-select signal (CS) that selects the pixel within the row that is due for readout. The switches could be driven by the same CS signal, or they could each be provided separate CS signals thereby reducing charge injection associated with switched-capacitor designs. While the pixel is idle (the pixel is not selected, i.e., CS is high), the capacitor 108 is floating, and the charge stored on its plates is kept constant. Also, the input FET 106 is disconnected from the readout line (ROW-BUS$^1$, ROW-BUS$^2$). When the pixel is due for readout, the CS signal goes low connecting the input FET 106 and capacitor 108 to the integrator's body. At the same time, the DAC 114 and photosensitive block 202 are connected to the integrator 110's summation node. According to the sampling clock, the quantizer 112 reads the integrator 110's output and sets the output digital value. A complementary logic, in which the input FET 106 and selecting transistors 206, 208, 210 are NMOS transistors, is possible. In such a case, the CS signal assumes complementary logic and the remainder of the integrator assumes complementary design, as well.

In another embodiment, the DAC could be placed at the pixel site. This results in the general first-order MIS ΣΔ ADC structure (with internal DAC) with intra-pixel integrator employing external capacitance, shown in FIG. 3 as 300. The structure 300 of FIG. 3 differs from the structure 200 of FIG. 2 in that the DAC, rather than being provided in the row-level ΣΔ ADC structure 304, is provided at the pixel site 302.

Figure 2:
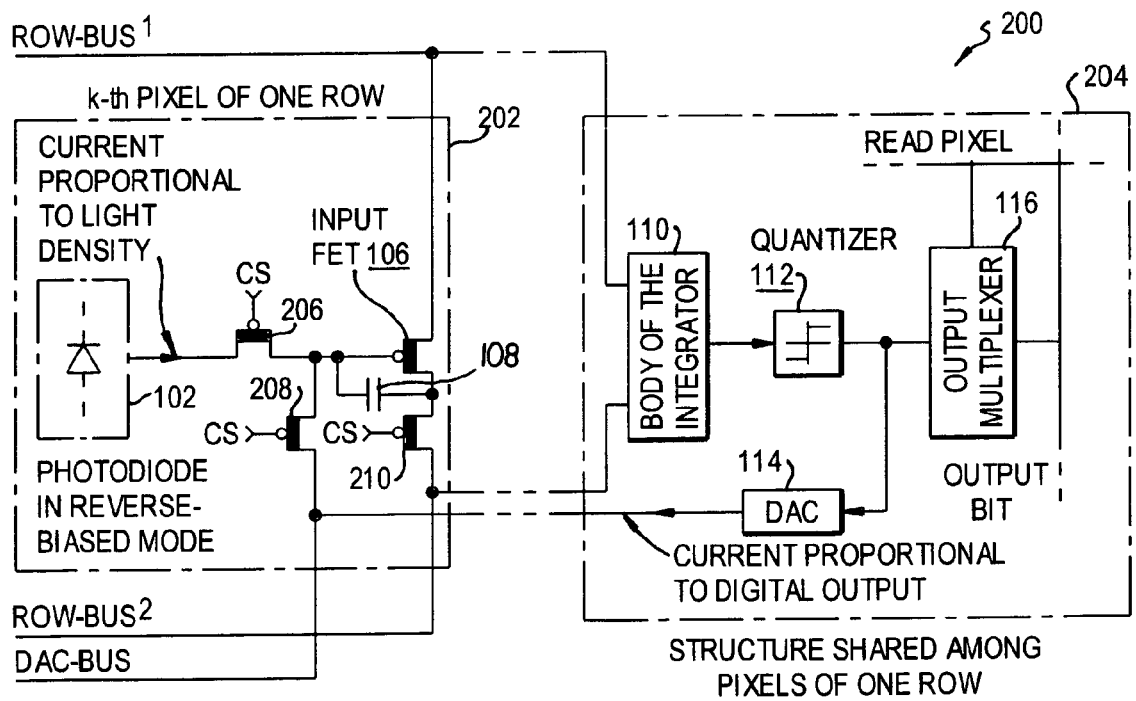
FIG. 2 is a schematic diagram showing a first variation of a first preferred embodiment of the present invention, based on the design of FIG. 1 and having a DAC located at the row-level structure.
Figure 3:
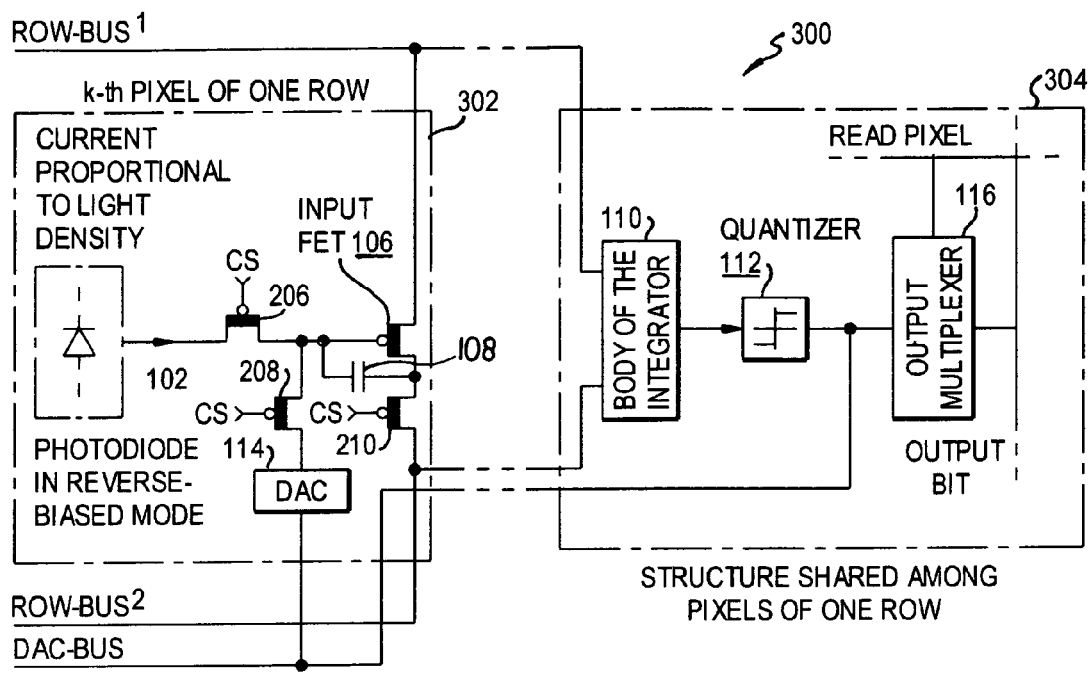
FIG. 3 is a schematic diagram showing a second variation of the first preferred embodiment of the present invention, based on the design of FIG. 1 and having a DAC located at the pixel-level structure.

The functionality of the structure shown in FIG. 3 is equivalent to the functionality of the structure shown in FIG. 2. A complementary logic, in which the input FET and selecting transistors are NMOS transistors, is possible. In such a case, the CS signal assumes complementary logic and the remainder of the integrator assumes complementary design, as well.

The second preferred embodiment and its variations will be described. The second preferred embodiment differs from the first in that the integration effect of the photodiode is used, such that the photodiode itself functions as the integrator of the ΣΔ ADC structure.

Figure 4:
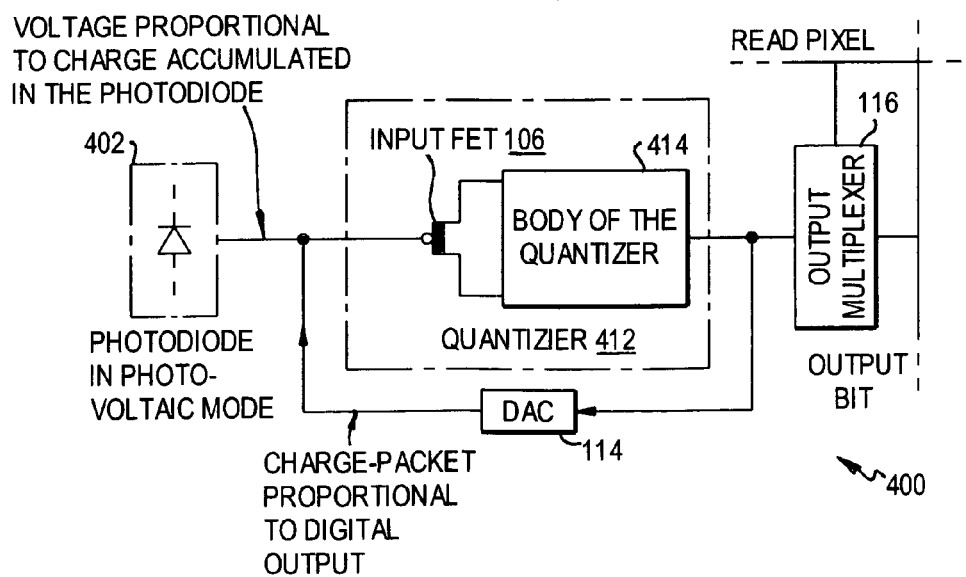
FIG. 4 is a schematic diagram showing a known $\Sigma\Delta$ ADC design for a single pixel using a photodiode with an integration effect.

A block schematic of the first-order pixel level ΣΔ ADC structure, where the integration effect of the photodiode in photo-voltaic mode is used, is shown in FIG. 4. The block 402 that represents the photosensitive element contains the photodiode and possibly a biasing circuit to keep the diode in the photo-voltaic mode (e.g., a reset switch). While in the photovoltaic mode, the terminals of the photo-diode are floating and the charge that is built up inside the diode is proportional to light intensity. The terminal voltage is proportional to the charge, and as such it is proportional to the light intensity. In conversion mode, when the ΣΔ ADC converts the input signal, the diode's terminal voltage is sensed by the quantizer 412 that produces the output. An input FET 106 is drawn separately from the rest of the quantizer 412's body 414, because it may be separated in the proposed MIS ΣΔ ADC structure. A block that represents the digital-to-analog converter (DAC) 114 creates a feedback signal required for ΣΔ analog-to-digital conversion. It senses the digital output and accordingly creates a charge packet that is stored in or removed from the diode.

Related to the placement of the DAC, we could pull the DAC out of the pixel site and make it a row-shared structure. This results in the general first-order MIS ΣΔ ADC structure (with external DAC) with the photodiode as an integrator, shown in FIG. 5 as 500.

In this design, an input FET 106 is retained within the pixel site 502 along with the photosensitive block 402. In order to accommodate multiplexing, two extra switches 208, 210 are added. These switches are driven by the Column-select signal (CS) that selects the pixel within the row that is due for readout. The switches could be driven by the same CS signal, or they could each be provided separate CS signals thereby reducing charge injection associated with switched-capacitor designs. While the pixel is idle (the pixel is not selected, i.e., CS is high), the photodiode is floating and its charge is kept constant. Also, the input FET is disconnected from the readout line. When the pixel is due for readout, the CS signal goes low connecting the input FET to the quantizer's body. At the same time the DAC is connected to the photodiode's terminal. According to the sampling clock, the quantizer reads the diode's terminal voltage and sets the output digital value. According to the output digital value, the DAC stores/removes a certain amount of charge on/from the diode. A complementary logic, in which the input FET and selecting transistors are NMOS transistors, is possible. In such a case CS signal assumes complementary logic and the remainder of the quantizer assumes complementary design, as well.

In another embodiment, the DAC could be placed at the pixel site. This results in the general first-order MIS ΣΔ ADC structure (with internal DAC) with the photodiode as an integrator, shown in FIG. 6 as 600. The structure 600 of FIG. 6 differs from the structure 500 of FIG. 5 in that the DAC 114 is located not at the structure 604 shared among the pixels of a row, but at the pixel location 602.

The functionality of the structure shown in FIG. 6 is equivalent to the functionality of the structure shown in FIG. 5. A complementary logic, in which the input FET and selecting transistors are NMOS transistors, is possible. In such a case CS signal assumes complementary logic and the remainder of the quantizer assumes complementary design, as well.

Those skilled in the art would be able to envision the designs shown in FIGS. 2, 3, 5 and 6, where a photogate or other photosensitive element instead of the photodiode might be used, as well.

Two preferred embodiments, each with two variations, have been disclosed above. In the following text, we will explain particular realizations of the embodiments. The particular realizations are based on existing designs, but with elements removed from the pixel level to row-shared structures in a manner to be described.

Figure 7:
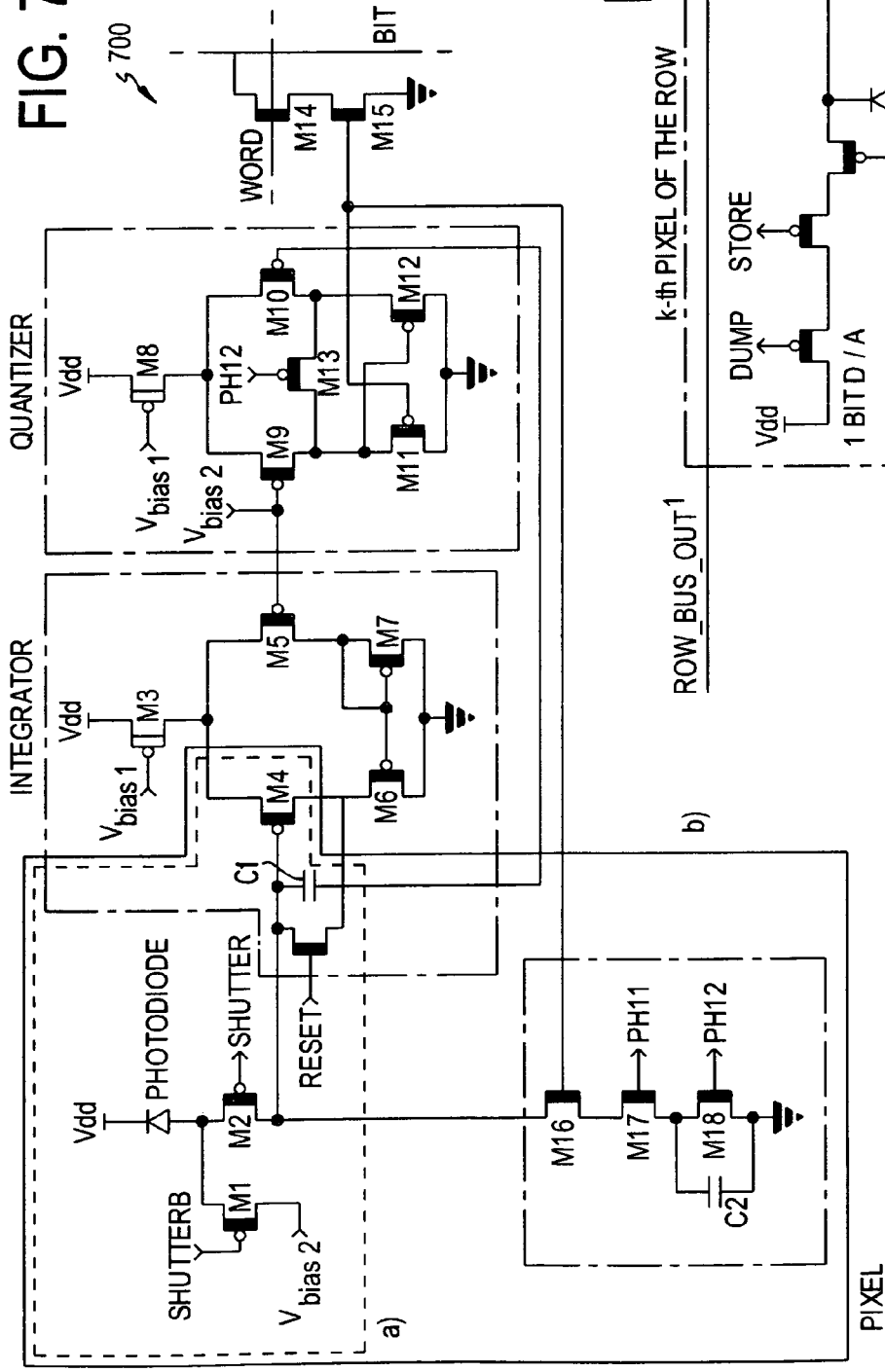
FIGS. 7–9 are circuit diagrams corresponding to the schematic diagrams of FIGS. 1–3.

An existing design in which a ΣΔ ADC is associated with each pixel is shown in FIG. 7 as 700. The photodiode is always in the reverse-biased mode regardless of the timing sequence due to the constant voltage (Vdd-Vbias2) across the diode terminals. This is even true when M2 is "on" due to the negative feedback that holds the gate of M4 to Vbias2. Depending on the timing, the photocurrent flows either onto the integration capacitor C1 or it is driven into the biasing node Vbias2 through M1. The integrator consists of an input differential pair M4 and M5, active load M6 and M7, and M3 that provides constant current for the differential pair. The capacitor C1 connects the output of the integrator and the negative input realizing the negative feedback required for the integration. The quantizer/latch structure is made of transistors M8, M9, M10, M11 and M12. A 1-bit DAC operates such that when the output of the quantizer is "1", it connects an empty capacitor C2 to the integrator's summing node that has a potential of Vbias2. When connected to Vbias2 the capacitor C2 removes a charge equal to Vbias2*C2 from the capacitor C1 realizing the negative ΣΔ feedback. In the process of separation one has to be careful to preserve a memory element (capacitor C1) at the pixel site. Also, in order to avoid susceptibility to external noise, gain mismatch, and cross-talk, we further propose a MIS ΣΔ ADC structure where in the separation a high-gain transistor M4 is retained within the pixel as well. An extra switch must be added in series with M4 to perform column selection.

Figure 8:
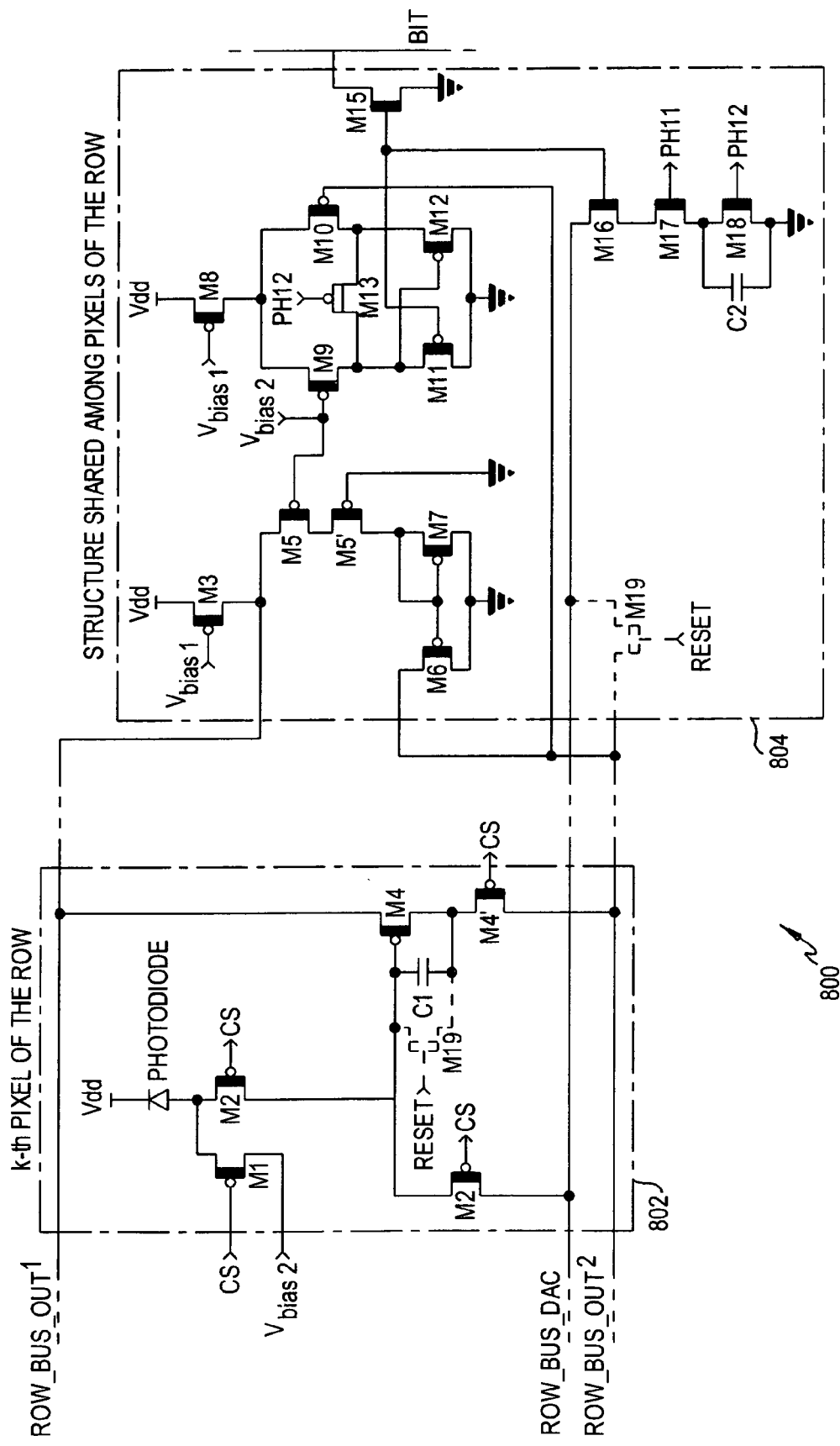

Related to the placement of the DAC, a realization 800 is shown in FIG. 8, in which the DAC is moved out of the pixel site 802 and into the row-shared structure 804.

The switch M4' is added in series with the amplification transistor M4 in order to enable the column selection (CS) function. When the CS signal is high, such in as the case when the MIS ΣΔ structure reads other pixels in the row (holding phase), the photodiode is reverse-biased to a fixed voltage through M1. The capacitor C1 is floating allowing its charge to be preserved for the next integration phase. The photocurrent, generated inside the diode, does not charge the capacitor. When the MIS ΣΔ ADC structure is due to read the k-th pixel, the CS signal goes low. The transistor M4' ties the transistor M4 to the row-bus. Transistor M4 together with M3, M5, M5', M6 and M7 creates a differential single-ended op-amp structure, which together with the capacitor C1 constitutes the integrator. The transistor M5' is added in order to balance the asymmetry created by adding the selecting transistor M4'. Through the switch M2', the structure integrates the photocurrent onto the capacitor C1. In this phase, the diode does not change biasing conditions. It is reverse biased with the same terminal voltage as in the holding phase—i.e. the photodiode operates in the reverse-biased mode. At the same time, when CS is low, the switch M2 connects the feedback signal (DAC output signal) to the op-amp summing node, allowing the ΣΔ conversion. When the integration phase is complete, the CS signal goes high.

If resetting of all the pixels' states must happen simultaneously, an optional switch M19 may be placed at the pixel site. Otherwise, the resetting function can be realized out of the pixel. In this case, the external switch M19 connects the ROW_BUS_DAC and ROW_BUS_OUT² lines externally while the pixel is addressed (i.e., the CS signal is low) resetting the capacitor. Thus, each pixel has to be addressed in order to reset its state.

The total number of FETs per pixel depends on the implementation of the reset function. If the reset function is realized within each pixel, the total number of FETs per pixel is six. Otherwise, the number of FETs is five.

In order to estimate the working speed of the shared structure, we will assume that each pixel has to be sampled at the rate of 30 frames/s. If a 1.3 megapixel design is assumed, there will be 1024 pixels in each row. Thus, the shared structure has to perform a full-resolution conversion in less than 32.55 μs, equivalent to a speed of 30.72 kHz. In order to perform a full-resolution of 10 bits, the first-order ΣΔ ADC with single-bit internal quantizer has to oversample the input signal at least 101 times, which results in a sampling speed near 3.2 MHz. This speed is easily achieved in modern CMOS designs.

The other important advantage of having the DAC placed outside the pixel area, where the DAC area is less of a concern, is that a multibit DAC and quantizer may be used. This would significantly reduce the speed for the same resolution or increase the resolution, when the speed is kept the same. The total number of FETs per pixel is five, where four of them (M1, M2, M2', and M4') are small area switch transistor, and one (M4) is an amplification transistor whose size should be large enough to accommodate large open-loop gain and low noise design. Thus, the only fill-factor limiting element in this design would be transistor M4.

Figure 9:
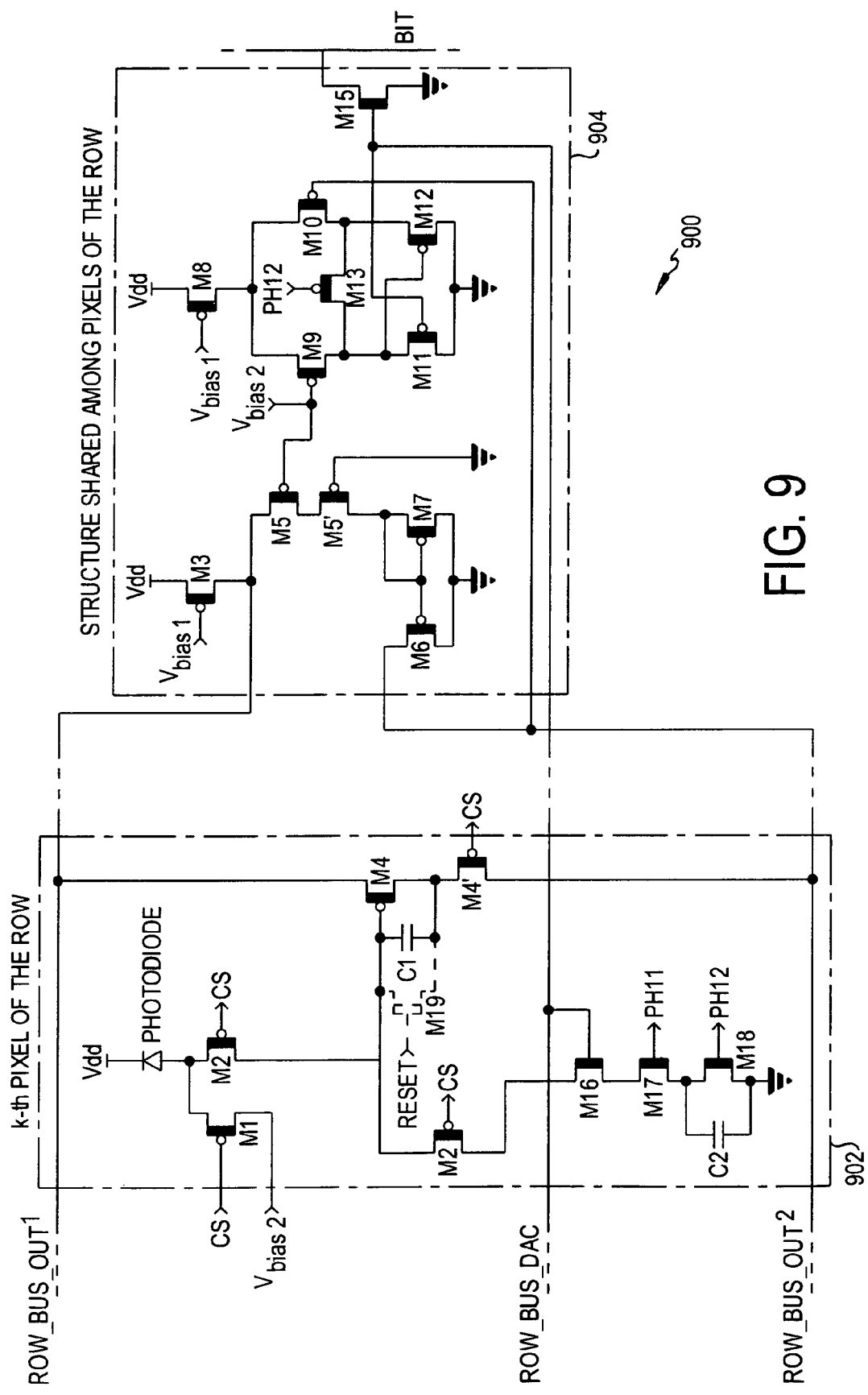

Although the fact that the DAC is shared among many pixels may improve the overall FPN (fixed pattern noise), a possible drawback of this design is that the feedback signal is analog rather than digital, which makes it susceptible to external noise. This fact might lead to an upper limit in the effective resolution. Thus, we may envision an alternative design where the DAC stays within the pixel area, shown in FIG. 9, in which the structure 900 includes a pixel-level structure 902 and a row-level structure 904. This design consumes more silicon area than the design in FIG. 8 by introducing extra FETs (M16, M17, and M18) and capacitor C2. A possible drawback is that by having separate DAC associated with each pixel site is likely to increase the FPN. Although the effective resolution may be increased by placing the DAC at the pixels, it is a huge price to pay in terms of the fill factor (area) and FPN.

Figure 10:
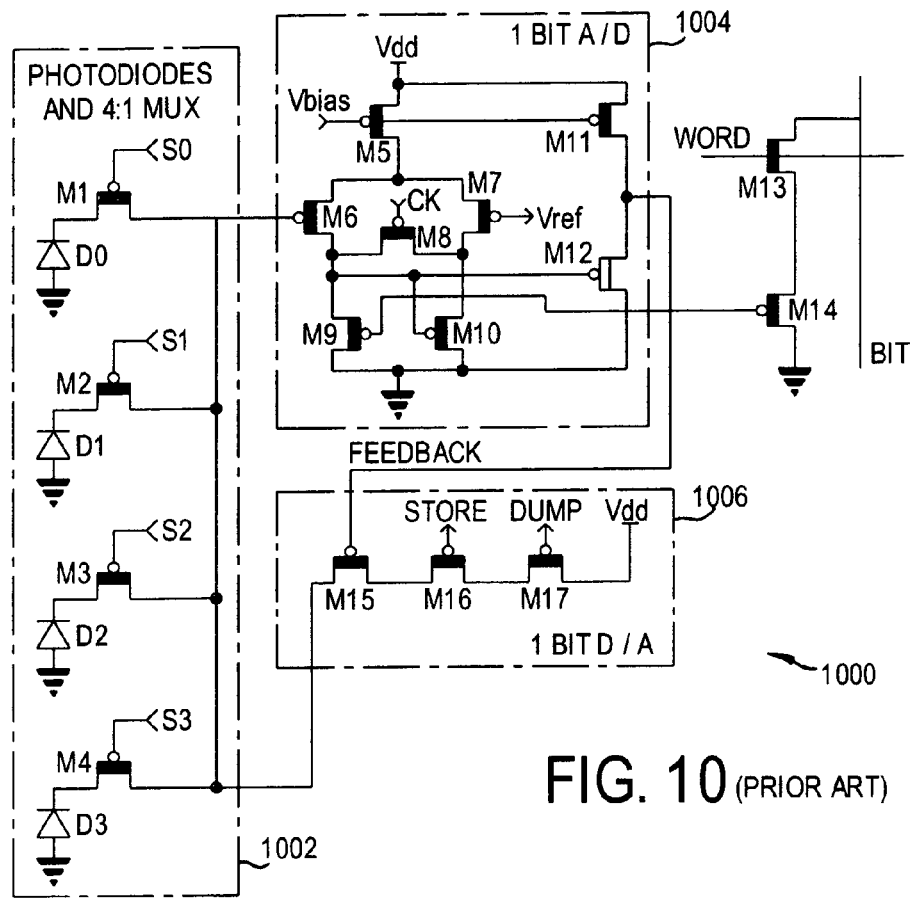
FIG. 10 is a circuit diagram showing a known $\Sigma\Delta$ ADC design for four photodetectors.

Additional realizations are based on a previously proposed ΣΔ ADC associated to groups of four neighboring pixels, shown in FIG. 10 as 1000. The structure is organized around a block 1004 having four photodiodes and a 4:1 MUX, a one-bit A/D block (quantizer/latch structure) 1004, and a one-bit D/A block 1006 for supplying feedback to the block 1002. That design is based on the integration effect of the photodiode while working in the photo-voltaic mode. The diode integrates an input signal (incident light) with positive gain and also it integrates the charge from the 1-bit DAC with negative gain realizing the ΣΔ negative feedback. The 1-bit quantizer/latch structure senses the voltage across the diode's terminals and compares its value with Vref. Although the charge-to-voltage characteristic is not linear, this does not influence the ΣΔ conversion. According to the comparison, the quantizer/latch decides whether to output a digital "1" or "0".

The 1-bit DAC reads the digital output, and if its value is "1" removes a fixed amount of charge from the photodiode (integrator). If the digital output value is "0", the DAC does not change the amount of charge accumulated within the diode. In particular, that design implements the 4:1 multiplexer structure, but in general the multiplexer structure N:1 could be used. In this design, the 1-bit DAC is realized as a charge transfer device (similar to a CCD), but experienced designers would be able to envision other DAC designs (e.g., a 1-bit DAC in current source/mirror topology). In particular, the quantizer/latch structure is implemented with regenerative feedback clocked via CK and it is operating in the subthreshold regime in other to preserve power and decrease noise. Again, many other quantizer/latch topologies are possible as well.

The design of FIG. 10 suffers from moderate FPN and high cross-talk. In order to correct for these problems we propose to separate the design into the MIS $\Sigma\Delta$ ADC. The basic idea of this separation is conceptually shown in FIG. 11, in which the structure 1100 has a pixel-level block 1102 separated from the row-level blocks 1004 and 1006.

Figure 11:
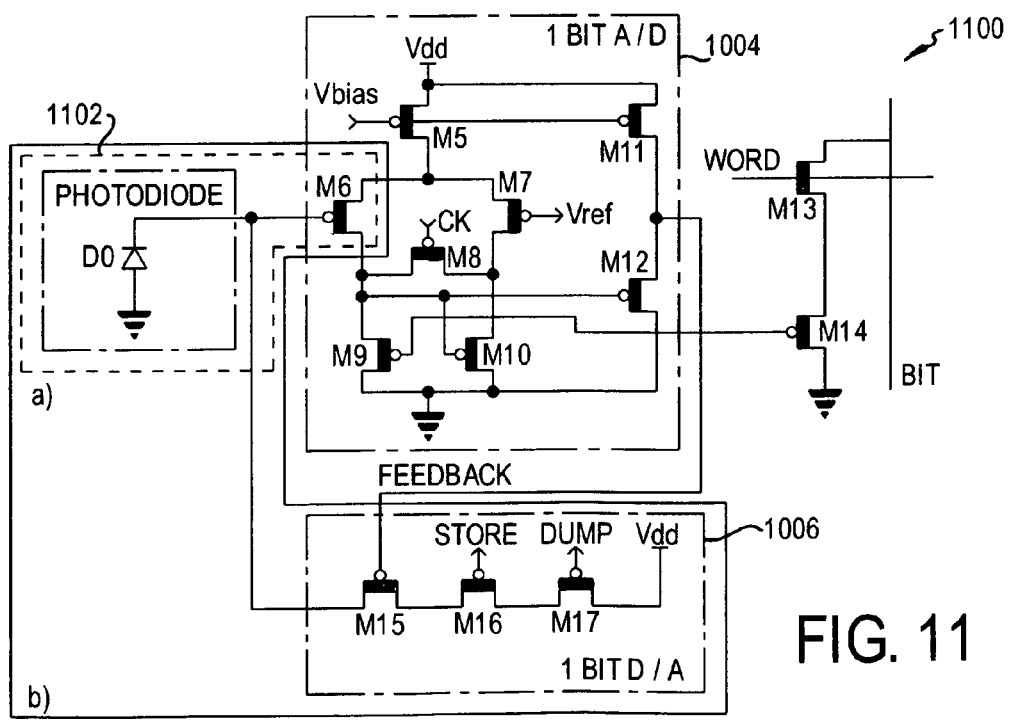
FIG. 11 shows a separation of the components of FIG. 10 between row and pixel levels.
Figure 12:
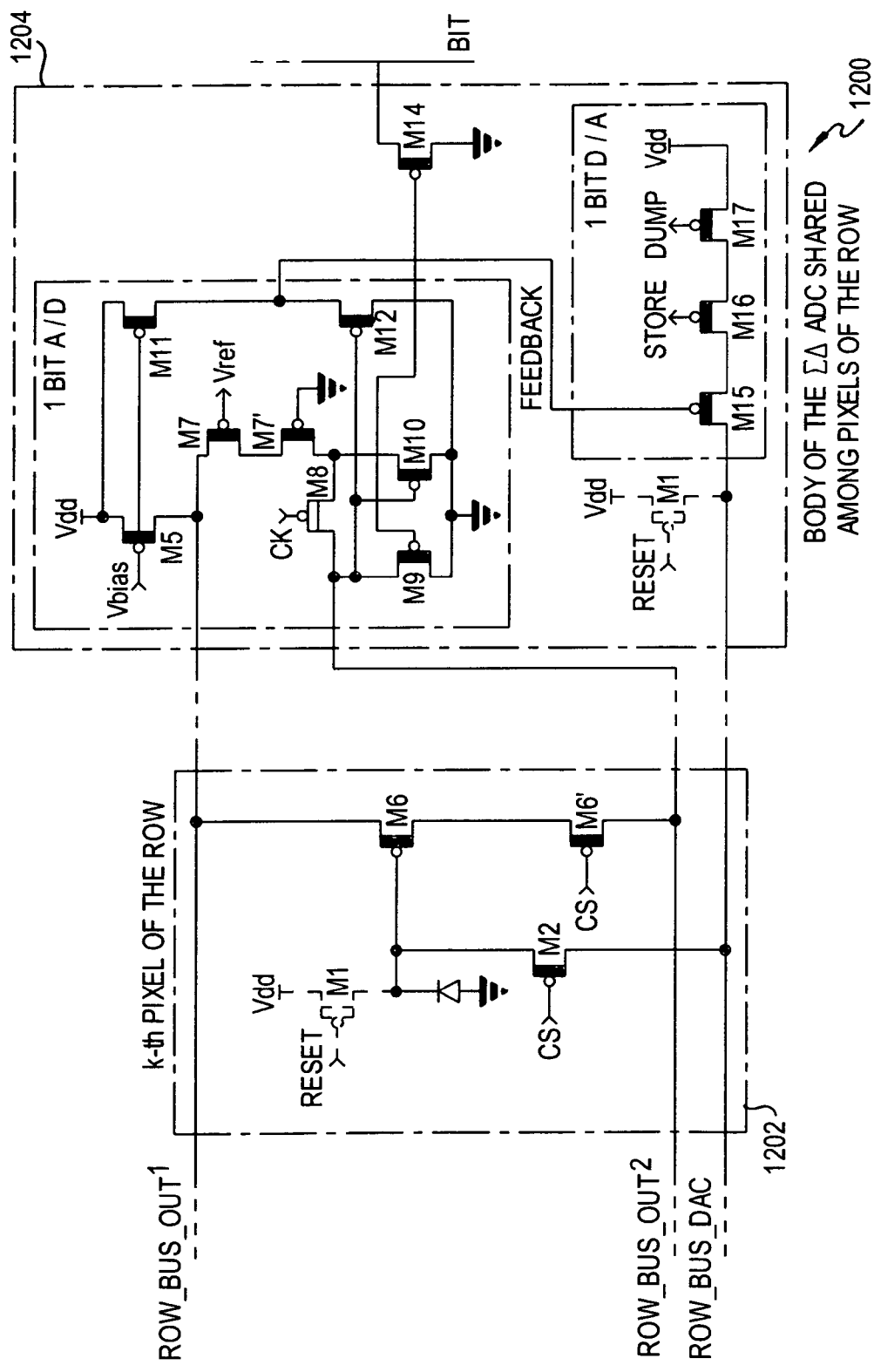
FIG. 12 is a circuit diagram showing the first variation of the second preferred embodiment, based on the separation of FIG. 11.

In the separation shown in FIG. 11, the 1-bit DAC is placed out of the pixel site. The specific realization is shown in FIG. 12, in which the structure is divided into pixel-level blocks 1202 and row-level blocks 1204. Once again, in order to correct for problems associated with the original design, the readout FET M6 is separated from the remainder of the $\Sigma\Delta$ body, and placed at the pixel site.

Similar to the MIS $\Sigma\Delta$ ADC shown in FIG. 8, an extra switch M6' is added to allow the column selection (CS) function. When the k-th pixel is idle (CS is high), the charge that is induced by the incident light accumulates at the diode's PN junction capacitance. When the MIS $\Sigma\Delta$ ADC is due to read the k-th pixel and to update the charge on the diode if necessary, the CS signal goes low. By doing so, the switch M6' connects the input transistor M6 to the body of the MIS $\Sigma\Delta$ ADC. Thus, M6 together with M5, M7, M7', M9, and M10 constitutes a 1-bit quantizer. The external 1-bit DAC reads the quantizer output, and if the output is logic "1" it removes a fixed amount of charge from the photodiode (integrator) performing negative $\Sigma\Delta$ feedback. The output bit is stored into either an external or on-chip memory location.

From the above, it will be clear the photodiode performs integrative sampling rather than point-to-point sampling. However, due to the inherent over-sampling nature of the $\Sigma\Delta$ ADC, the sinc-distortion is negligible—e.g. for the over-sampling ratio of 64 the sinc-distortion power is 40 dB smaller than the required dynamic range.

The important RESET function could be realized in two ways. If the pixel size issue is predominant, the RESET switch M1 could be placed out of the pixel as part of the MIS $\Sigma\Delta$ ADC body (FIG. 12). This way, when the photodiodes must be reset to their initial conditions, each pixel has to first be addressed. This way, the photodiodes may all be reset simultaneously or selectively on a column or pixel basis. If simultaneous or column reset is desirable, the reset switch M1 could be placed at the pixel site.

The total number of FETs per pixel depends on the implementation of the reset function. If the reset function is realized within the pixel, the total number of FETs per pixel is four. Otherwise, the number of FETs is three. By implementing the MIS $\Sigma\Delta$ ADC with the photodiode acting as an integrator and with the reset function placed out of the pixel area, the design described here has the potential to approach the fill factors reported in APS and ACS designs. We believe that the MIS $\Sigma\Delta$ ADC design presented here would have the smallest pixel size among all pixel level $\Sigma\Delta$ ADC designs that have been reported so far.

The working speed of the readout circuits, in order to achieve full-resolution at 30 frames per second, is estimated to be less than 3.2 MHz, which again is easily achievable in modern CMOS designs.

Figure 13:
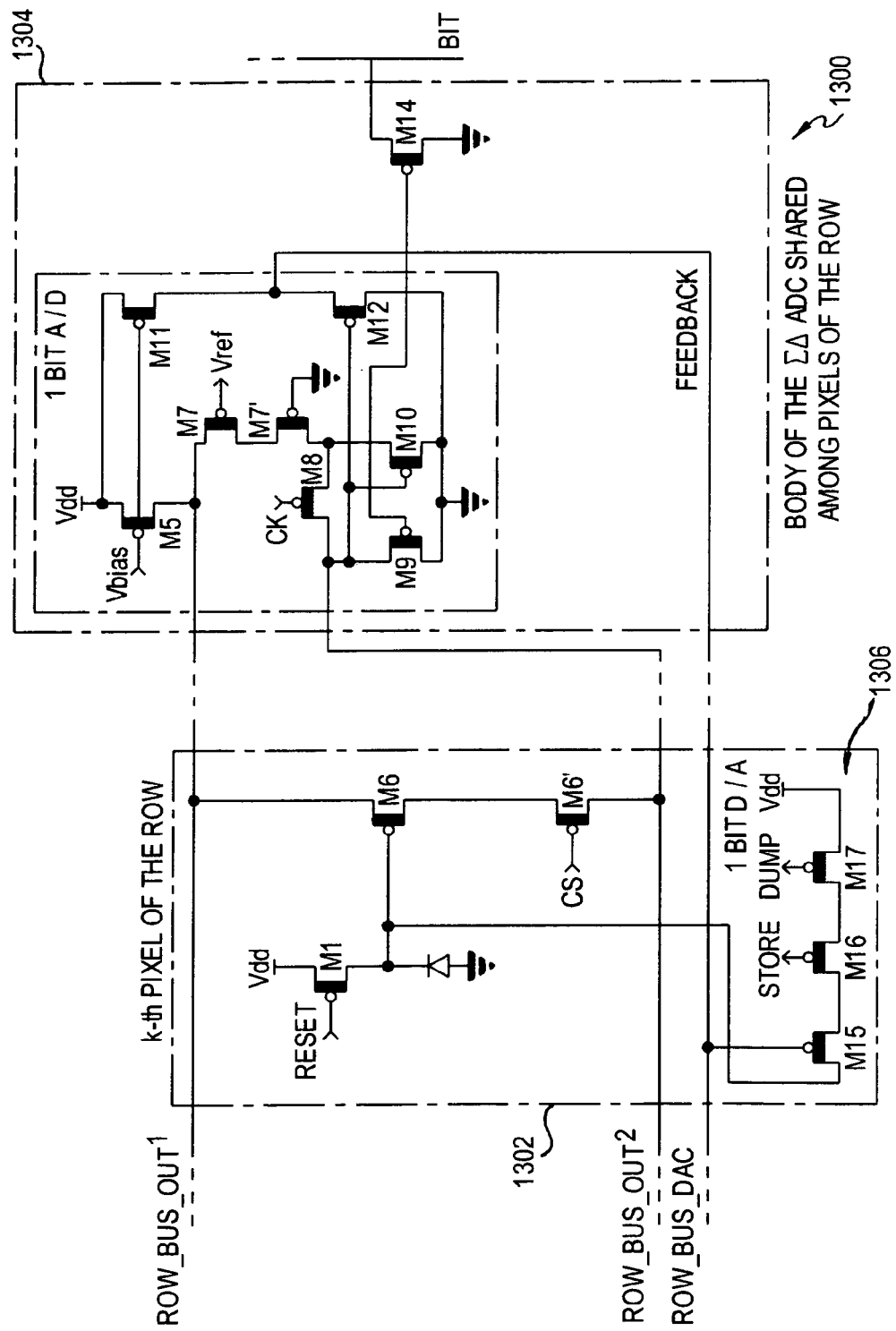
FIG. 13 is a circuit diagram showing the second variation of the second preferred embodiment, based on the separation of FIG. 11.

Once again, a possible drawback of having the DAC placed outside of the pixel-area is reduced effective resolution due to cross-talk. Thus, we propose an additional design that is based on the separation shown in FIG. 11. The proposed design is shown in FIG. 13 as 1300. In this realization the 1-bit DAC 1306 is placed inside the pixel area 1302 rather than the row-level structure 1304 in order to achieve the maximum effective resolution that could be realized with the first-order $\Sigma\Delta$ ADC. As a consequence, the number of FETs increases to six.

Figure 14:
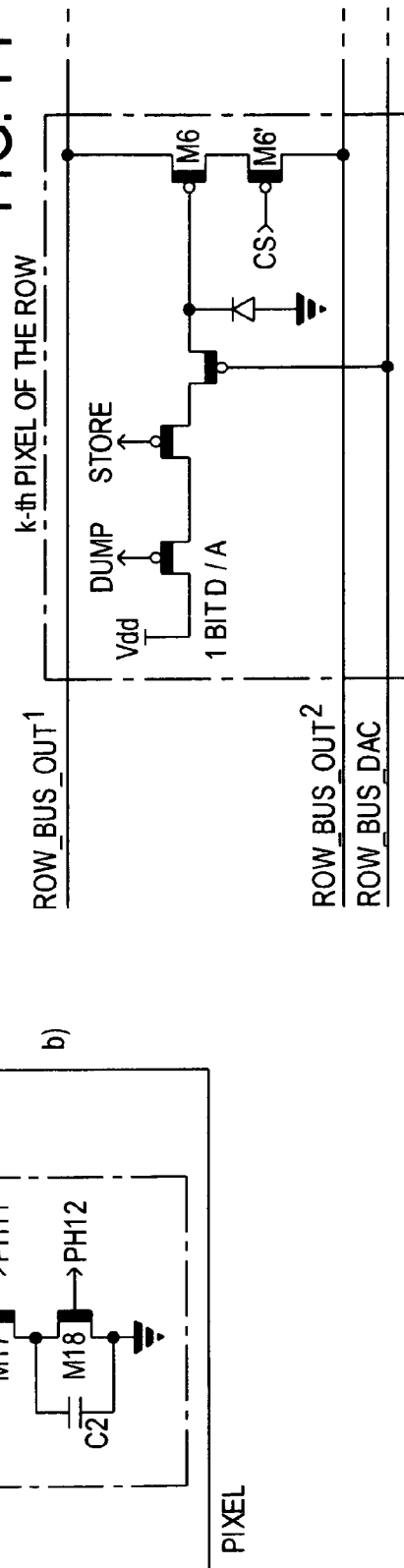
FIG. 14 is a circuit diagram of a DAC usable in the embodiment of FIG. 13.

The number of FETs could be reduced to five by removing the redundant RESET switch M1. Instead, the RESET function could be performed by employing the DAC structure, as shown in FIG. 14. In this case, when the pixels are due for reset, the signals STORE and DUMP assume the same value and timing as the signal CS. During the RESET operation, the transistor M16 would act as a switch, rather than the charge storage device that connects the photodiode to Vdd. Furthermore in this implementation the RESET function would not be performed simultaneously, but rather each pixel column would have to be addressed separately.

Also, by placing the DAC at the pixel site, an increase in FPN is likely to occur due to mismatch between DAC transistors. Once again, we deal with a trade-off between the high effective resolution, small pixel and low FPN. However, it is expected that the small pixel and low FPN will emerge as the more important constraints, so we favor the MIS $\Sigma\Delta$ ADC with DAC placed out of the pixel area (FIG. 12).

While preferred embodiments and variations thereon have been set forth above in detail, those skilled in the art who have reviewed the present disclosure will readily appreciate that other embodiments can be realized within the scope of the invention. For example, as noted above, different photosensitive elements can be used. Also, different transistor technologies and fabrication techniques can be used in the present invention. Moreover, the pixels can be grouped by column (or any other suitable grouping) rather than by row. Therefore, the present invention should be construed as limited only by the appended claims.

We claim:

1. An image-sensing system comprising:
   a plurality of photosensitive elements, arranged in a plurality of rows (or columns), each for converting incident light to a photogenerated electric charge;
   for each of the plurality of photosensitive elements, a pixel-level structure comprising an amplifying element for amplifying the signal that is in proportion to the photogenerated charge;
   for each of the plurality of rows (or columns), a row-level (or column-level) structure, in communication with the pixel-level structure of each photosensitive element in the row (or column), for performing quantization of the signal that is in proportion to the photogenerated charge from each of the plurality of pixel-level structures; and
   for each of the plurality of rows (or columns), a feedback loop connected from the row-level (or column-level) structure to the amplifying element of each of the plurality of pixel-level structures in the row (or column) to supply a feedback signal;

wherein each pixel-level structure, the corresponding row-level (or column level) structure, and the corresponding feedback loop define a sigma-delta analog-to-digital converter having multiplexed inputs corresponding to the pixel-level structures in the row (or column).

2. The image-sensing system of claim 1, wherein:
each of the row-level (or column-level) structures comprises a circuit that together with the amplifying element of the pixel-level structure constitutes an integrator for integrating the signal that is proportional to the photogenerated charge to supply an integrated signal and a quantizer for quantizing the integrated signal; and
each of the pixel-level structures further comprises a capacitor connected between an output of the integrator and the input of the amplifying element (inverting input of the integrator).

3. The image-sensing system of claim 2, wherein the feedback loop comprises a digital-to-analog converter bus connecting the row-level (or column-level) structure with each pixel-level structure in the row (or column).

4. The image-sensing system of claim 3, wherein the feedback loop further comprises a digital-to-analog converter located in the row-level (or column-level) structure and connected between the quantizer and the digital-to-analog converter bus.

5. The image-sensing system of claim 4, wherein the pixel-level structure further comprises:
a first switch, connected between the digital-to-analog converter bus and the amplifying element and responsive to the column (or row) select signal, for switching on to connect the digital-to-analog converter bus to the amplifying element; and
a second switch, connected between the amplifying element and the row-level (or column-level) structure and responsive to the column (or row) select signal, for switching on to connect the amplifying element to the row-level (or column-level) structure.

6. The image-sensing system of claim 5, wherein the pixel-level structure further comprises:
a third switch, connected between the photosensitive element and the amplifying element and responsive to a column (or row) select signal, for switching on to connect the photosensitive element to the amplifying element.

7. The image-sensing system of claim 5, wherein the pixel-level structure further comprises:
a third switch, connected in series with the external capacitor and responsive to a column (or row) integrate signal, for switching on to connect the external capacitor to the amplifying element and integrator's output.

8. The image-sensing system of claim 6, wherein the pixel-level structure further comprises:
a fourth switch, connected in series with the external capacitor and responsive to a column (or row) integrate signal, for switching on to connect the external capacitor to the amplifying element and integrator's output.

9. The image-sensing system of claim 3, wherein the feedback loop further comprises a digital-to-analog converter located in each pixel-level structure and connected between the digital-to-analog converter bus and the amplifying element.

10. The image-sensing system of claim 4, wherein the pixel-level structure further comprises:
a first switch, connected between the digital-to-analog converter and the amplifying element and responsive to the column (or row) select signal, for switching on to connect the digital-to-analog converter to the amplifying element; and
a second switch, connected between the amplifying element and the row-level (or column-level) structure and responsive to the column (or row) select signal, for switching on to connect the amplifying element to the row-level (or column-level) structure.

11. The image-sensing system of claim 10, wherein the pixel-level structure further comprises:
a third switch, connected between the photosensitive element and the amplifying element and responsive to a column (or row) select signal, for switching on to connect the photosensitive element to the amplifying element.

12. The image-sensing system of claim 10, wherein the pixel-level structure further comprises:
a third switch, connected in series with the external capacitor and responsive to a column (or row) integrate signal, for switching on to connect the external capacitor to the amplifying element and integrator's output.

13. The image-sensing system of claim 11, wherein the pixel-level structure further comprises:
a fourth switch, connected in series with the external capacitor and responsive to a column (or row) integrate signal, for switching on to connect the external capacitor to the amplifying element and integrator's output.

14. The image-sensing system of claim 1, wherein each of the photosensitive elements performs integration of the photogenerated charge.

15. The image-sensing system of claim 14, wherein the feedback loop comprises a digital-to-analog converter bus connecting the row-level (or column-level) structure with each pixel-level structure in the row (or column).

16. The image-sensing system of claim 15, wherein the feedback loop further comprises a digital-to-analog converter located in the row-level (or column-level) structure and connected between the quantizer and the digital-to-analog converter bus.

17. The image-sensing system of claim 16, wherein the pixel-level structure further comprises:
a first switch, connected between the digital-to-analog converter bus and the amplifying element and responsive to a column (or row) select signal, for switching on to connect the digital-to-analog converter bus to the amplifying element; and
a second switch, connected between the amplifying element and the row-level (or column-level) structure and responsive to the column (or row) select signal, for switching on to connect the amplifying element to the row-level (or column-level) structure.

18. The image-sensing system of claim 15, wherein the feedback loop further comprises a digital-to-analog converter located in each pixel-level structure and connected between the digital-to-analog converter bus and the amplifying element.

19. The image-sensing system of claim 18, wherein the pixel-level structure further comprises:
a first switch, connected between the digital-to-analog converter and the amplifying element and responsive to a column (or row) select signal, for switching on to connect the digital-to-analog converter to the amplifying element; and
a second switch, connected between the amplifying element and the row-level (or column-level) structure and responsive to the column (or row) select signal, for switching on to connect the amplifying element to the row-level (or column-level) structure.

20. The image-sensing system of claim 1, wherein each photodetecting element comprises a photodiode.

21. The image-sensing system of claim 20, wherein, in each pixel-level structure, the amplifying element comprises a field-effect transistor.

22. An image-sensing system comprising:

a plurality of photosensitive elements, arranged in a plurality of groups, each for converting incident light to a photogenerated electric charge;

for each of the plurality of photosensitive elements, a pixel-level structure comprising an amplifying element for amplifying the signal that is in proportion to the photogenerated charge;

for each of the plurality of groups, a group-level structure, in communication with the pixel-level structure of each photosensitive element in the group, for performing quantization of the signal that is in proportion to the photogenerated charge from each of the plurality of pixel-level structures; and for each of the plurality of groups, a feedback loop connected from the group-level structure to the amplifying element of each of the plurality of pixel-level structures in the group to supply a feedback signal;

wherein each pixel-level structure, the corresponding group-level structure, and the corresponding feedback loop define a sigma-delta analog-to-digital converter having multiplexed inputs corresponding to the pixel-level structures in the group.

* * * * *